US006373694B1

(12) United States Patent
Chang

(10) Patent No.: US 6,373,694 B1
(45) Date of Patent: Apr. 16, 2002

(54) FASTENING DEVICE FOR HARD DISK

(75) Inventor: Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 64 days.

(21) Appl. No.: 09/635,414

(22) Filed: Aug. 10, 2000

(51) Int. Cl.$^7$ ................................................ H05K 7/14
(52) U.S. Cl. ............................. 361/685; 361/683–686; 361/724–727; 312/223.1; 312/223.2; 248/65; 248/73; 439/53; 439/928.1
(58) Field of Search ............................. 361/685, 683, 361/684, 686, 724–727, 807, 809; 312/223.1, 223.2, 222, 349, 350; 248/65, 73, 535, 534; 439/53, 152, 157, 928.1

(56) References Cited

U.S. PATENT DOCUMENTS

| | | | | | |
|---|---|---|---|---|---|
| 5,306,079 A | * | 4/1994 | Liu | .......................... | 312/223.2 |
| 5,332,306 A | * | 7/1994 | Babb et al. | ............. | 312/334.16 |
| 5,340,340 A | * | 8/1994 | Hastings et al. | ............... | 439/64 |
| 5,510,955 A | * | 4/1996 | Taesang | ...................... | 361/685 |
| 5,668,696 A | * | 9/1997 | Schmitt | ....................... | 361/685 |
| 5,717,570 A | * | 2/1998 | Kikinis | ........................ | 361/685 |
| 6,058,016 A | * | 5/2000 | Anderson et al. | ............ | 361/727 |
| 6,122,173 A | * | 9/2000 | Felcman et al. | ............. | 361/726 |
| 6,188,571 B1 | * | 2/2001 | Roganti et al. | ............. | 361/685 |
| 6,201,692 B1 | * | 3/2001 | Gamble et al. | ............. | 361/685 |
| 6,288,902 B1 | * | 9/2001 | Kim et al. | ................... | 361/725 |

* cited by examiner

Primary Examiner—Leo P. Picard
Assistant Examiner—David Foster
(74) Attorney, Agent, or Firm—Bacon & Thomas, PLLC

(57) ABSTRACT

A fastening device is configured on a frame to have a plurality of pairs of opposed grooves, a block member on one side of the frame with grooves disposed thereon, and a plurality of latched members disposed on the block member each corresponding to the groove. In fastening hard disk to frame, insert hard disk into frame with projections of hard disks sliding along grooves until one projection contacts the latched member to be secured therein. In detaching a hard disk, push engagement section of latched member to release the projection of hard disk clear from the latched member prior to removing one hard disk from frame. The advantage is that other hard disks may not drop from frame while one hard disk is removed.

4 Claims, 5 Drawing Sheets

FASTENING DEVICE FOR HARD DISK

FIELD OF THE INVENTION

The present invention relates to the art of fastening devices and more particularly to a fastening device for hard disk having improved characteristics.

BACKGROUND OF THE INVENTION

A conventional fastening device for hard disk is shown in FIG. 1. The fastening device is configured on a frame 1 having a plurality of pairs of opposed grooves 10. Each groove 10 on one side of the frame 1 has an expanded opening 102 on one end opposite to the openings of the frame for installing hard disks. An extension member 12 is projected laterally from one side of the frame adjacent to the side of the expanded openings 102, and a pair of slots 122 are disposed on the opposed sides of extension member 12. A block member 2 is installed on frame 1 at the side covering the expanded openings 102. A pair of snapping members 22 disposed on the opposed sides of block member 2 are engaged with slots 122 so as to secure block member 2 to frame 1. A plurality of latched members 24 are respectively disposed on block member 2 at the positions facing the expanded openings 102, and a spring 26 provided in a hole of block member 2. Also, a plurality of pairs of projections 32 disposed on either side of hard disk 3 (e.g., top and bottom sides as shown) for cooperating with grooves 10.

In fastening hard disk 3 to frame 1, insert hard disk 3 into frame 1 through the openings thereof with projections 32 sliding along grooves 10 until projections 32 pass over latched members 24. At this moment, projections 32 are secured in expanded openings 102 by latched members 24. This procedure may repeat until a desired number of hard disks 3 are mounted in frame 1.

In removing hard disk 3 from frame 1, it is necessary to first move block member 2 toward extension member 12 to compress spring 26 for releasing projections 32 from latched members 24. Block member 2 will return to its original position by virtue of the elastic force of spring 26 after hard disk 3 is removed from frame 1. Then, projections 32 of the rest hard disks are again secured by the latched members 24.

However, the previous design suffered from several disadvantages. For example, all projections 32 become disengaged from latched members 24 when only removing one hard disk 3 from frame 1 by moving block member 2. This may cause other hard disks 3 to drop from frame 1. Also, there are gaps between snapping members 22 and slots 122. Such gaps may deviate block member 2 from the correct course while moving which in turn may cause block member 2 to squeeze therebetween. It is inconvenient and troublesome. Further, the engagement of block member 2 and frame 1 is not secured, and spring 26 is not easily fastened between frame 1 and block member 2. Moreover, the projection of extension member 12 makes frame 1 difficult to mount in an electronic apparatus, resulting in an increase of manufacturing time and cost. This adversely affects the competence in the market.

SUMMARY OF THE INVENTION

It is thus an object of the present invention to provide a fastening device for hard disk. The fastening device is configured on a frame to have a plurality of pairs of opposed grooves, a block member installed on one side of the frame with grooves disposed thereon having a plurality of latched members corresponding to the grooves. In fastening hard disk to frame, insert hard disk into frame with projections of hard disks sliding along grooves until one projection contacts the latched member to be secured therein.

In one aspect of the present invention, projection of each hard disk is individually secured and released by operating the corresponding latched member. The advantage is that other hard disks may not drop from frame while the projection of one hard disk is released by pushing the corresponding latched member prior to removing the hard disk from frame.

In another aspect of the present invention, snapping members of block member are engaged with slots of frame for securing block member to frame, resulting in a decrease of assembly time.

In still another aspect of the present invention, block member is not moveable on frame such that a space required for sliding block member on frame is eliminated, resulting in a reduction of the size of frame and thus the cost thereof.

The above and other objects, features and advantages of the present invention will become apparent from the following detailed description taken with the accompanying drawings.

DETAILED DESCRIPTION OF THE PREFERRED EMBODIMENTS

Figure 1:
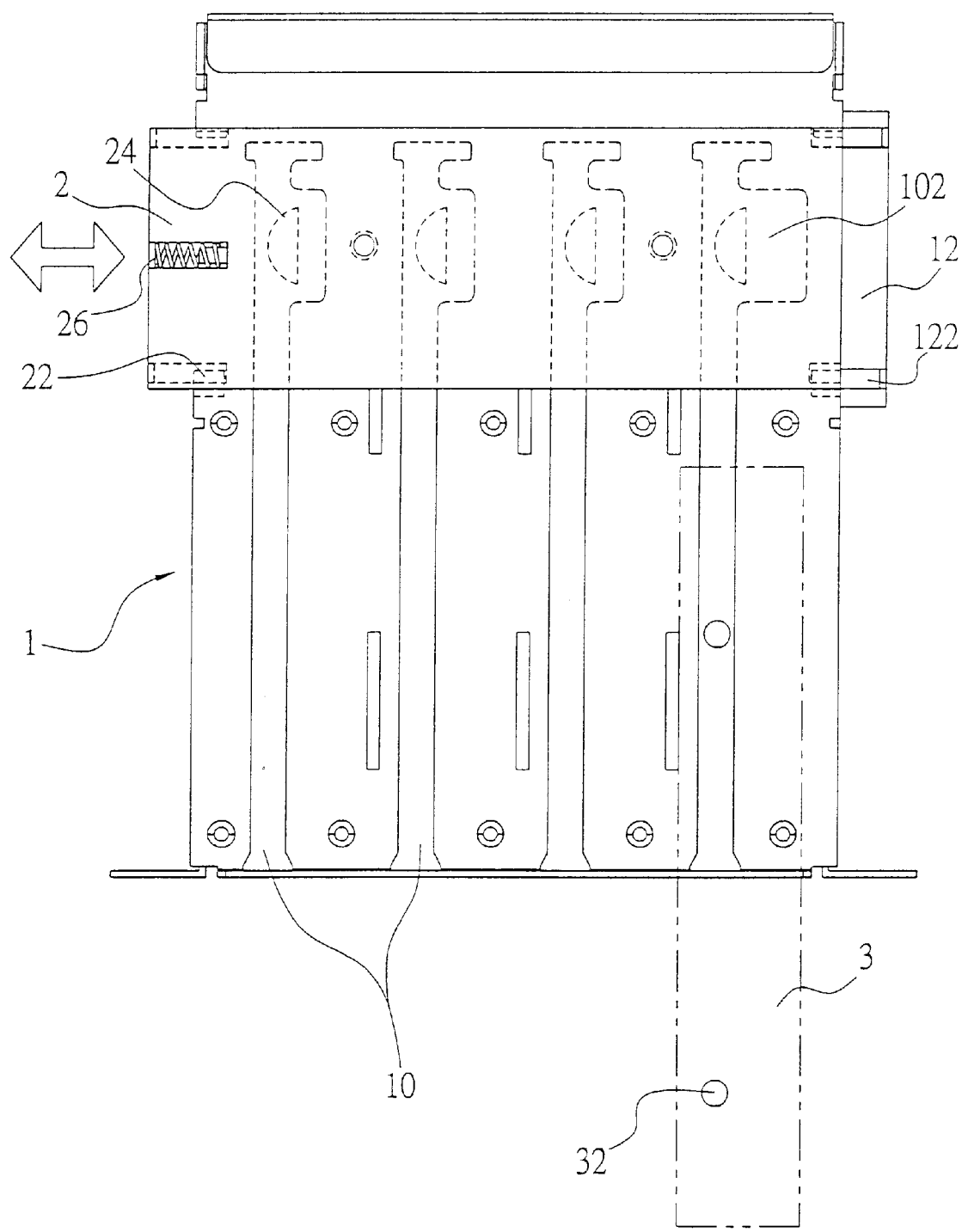
FIG. 1 is a top view schematically showing a conventional fastening device for hard disk.
Figure 2:
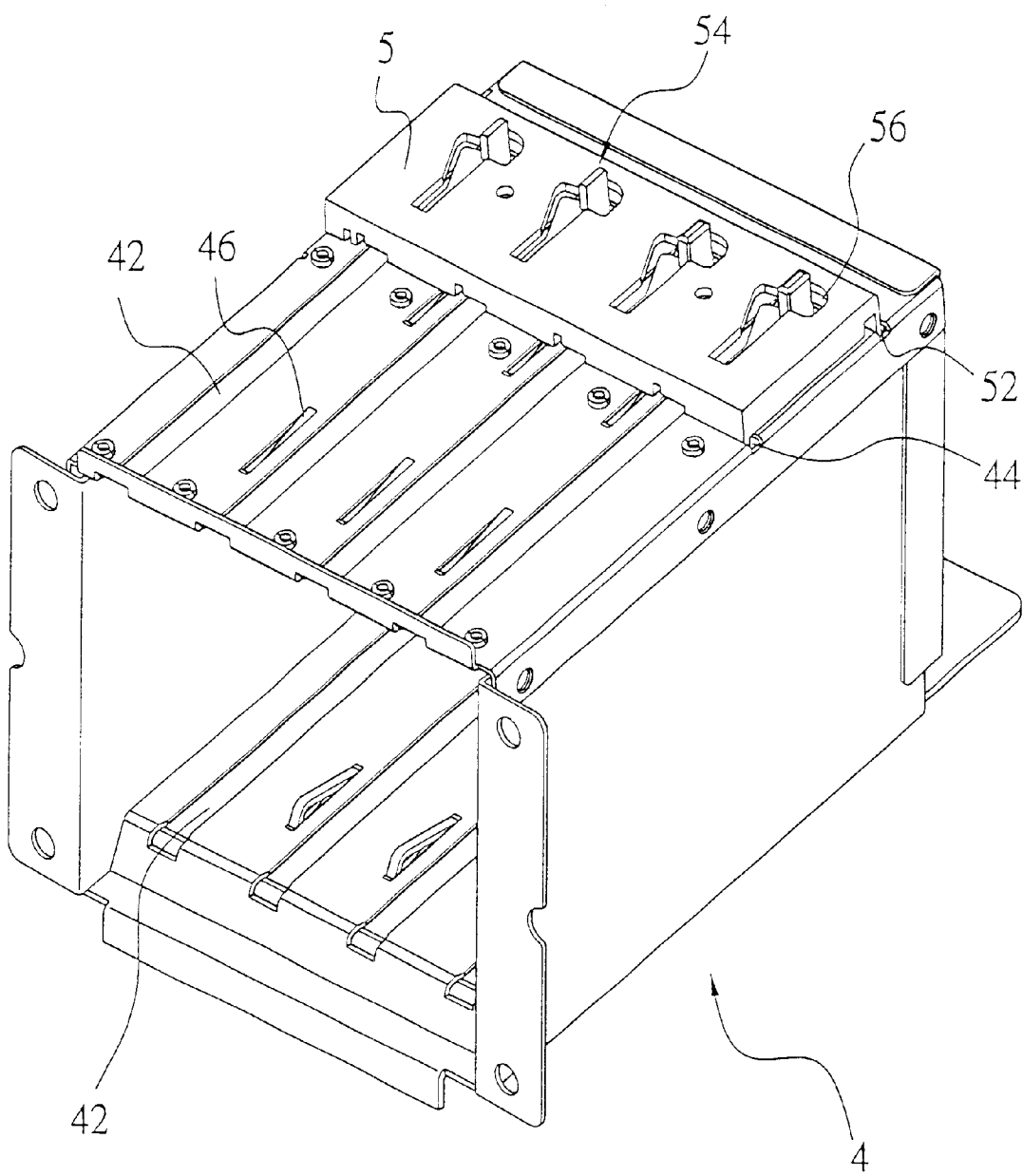
FIG. 2 is a perspective view of a fastening device for hard disk according to the invention.
Figure 3:
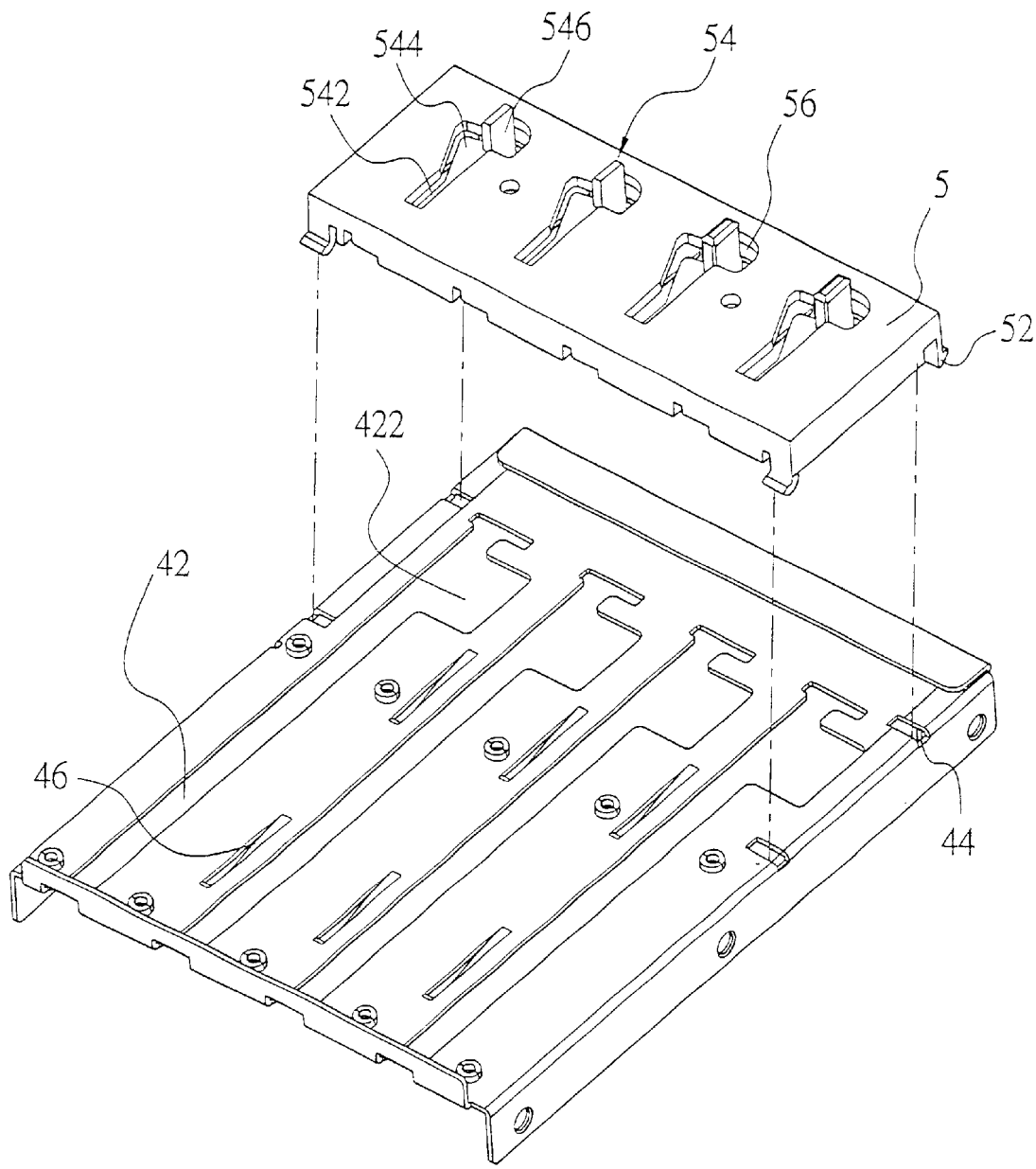
FIG. 3 is a partial broken-apart perspective view of FIG. 2.
Figure 4:
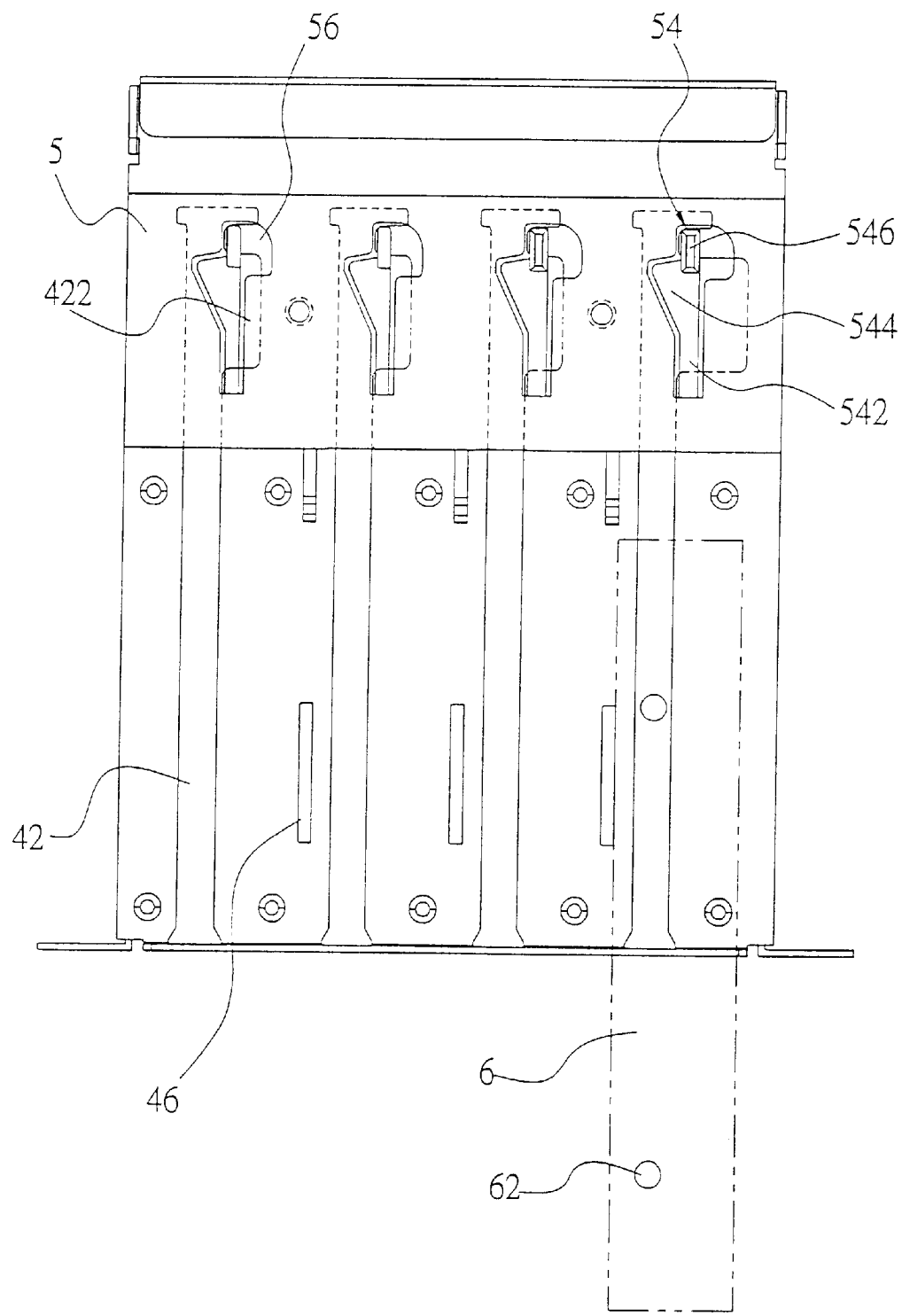
FIG. 4 is a top view schematically showing the FIG. 2 fastening device wherein hard disk is not secured to frame.

Referring to FIGS. 2, 3, and 4, there is shown a fastening device for hard disk constructed in accordance with the invention. The fastening device is configured on a frame 4 to have a plurality of pairs of opposed grooves 42. A block member 5 is installed on one side of the frame having grooves 42 thereon, and a plurality of latched members 54 are disposed on the block member 5 each corresponding to the groove 42. In fastening hard disk 6 to frame 4, insert hard disk 6 into frame 4 with projections 62 of hard disk 6 sliding along grooves 42 until one projection 62 contacts latched member 54 to be secured therein. This procedure may repeat until a desired number of hard disks 6 are mounted in frame 4. In detaching hard disk 6 from frame 4, push the engagement section 546 of latched member 54 to release projection 62 of hard disk 6 from the latched member 54 prior to removing hard disk 6 from frame 4. Since the projection 62 of each hard disk 6 is individually secured and released by operating the corresponding latched member 54, the advantage is that other hard disks 6 may not drop from frame 4 while one hard disk 6 is removed by pushing the corresponding engagement section 546 of latched member 54.

Referring to FIG. 3, an opening 422 is provided on one end of each groove 42 on one side of the frame, a pair of slots 44 are provided on either side of the top of frame 4, and a plurality of pairs of recesses 46 are provided on either side of frame 4 adjacent to the grooves 42. A plurality of pairs of projections 62 on either side of hard disk 3 (e.g., top and bottom sides as shown) for cooperating with the grooves 42 on the frame 4.

Again referring to FIG. 3 specifically, four snapping members 52 are extended downward on four corners of the bottom of block member 5 for engaging with slots 44 so as to secure block member 5 to frame 4. A plurality of latched members 54 are respectively provided in apertures 56 disposed at the positions on block member 5 corresponding to openings 422. Each latched member 54 comprises a connection section 542 connected to block member 5, a bent section 544 adjacent to the edge of the opening 422 having one end connected to the connection section 542 and, an engagement section 546 having one upward extended through the aperture 56 and the other end connected to the other end of bent section 544. It is designed that the engagement section 546 may be moved within the space defined by aperture 56 when being pushed.

Figure 5:
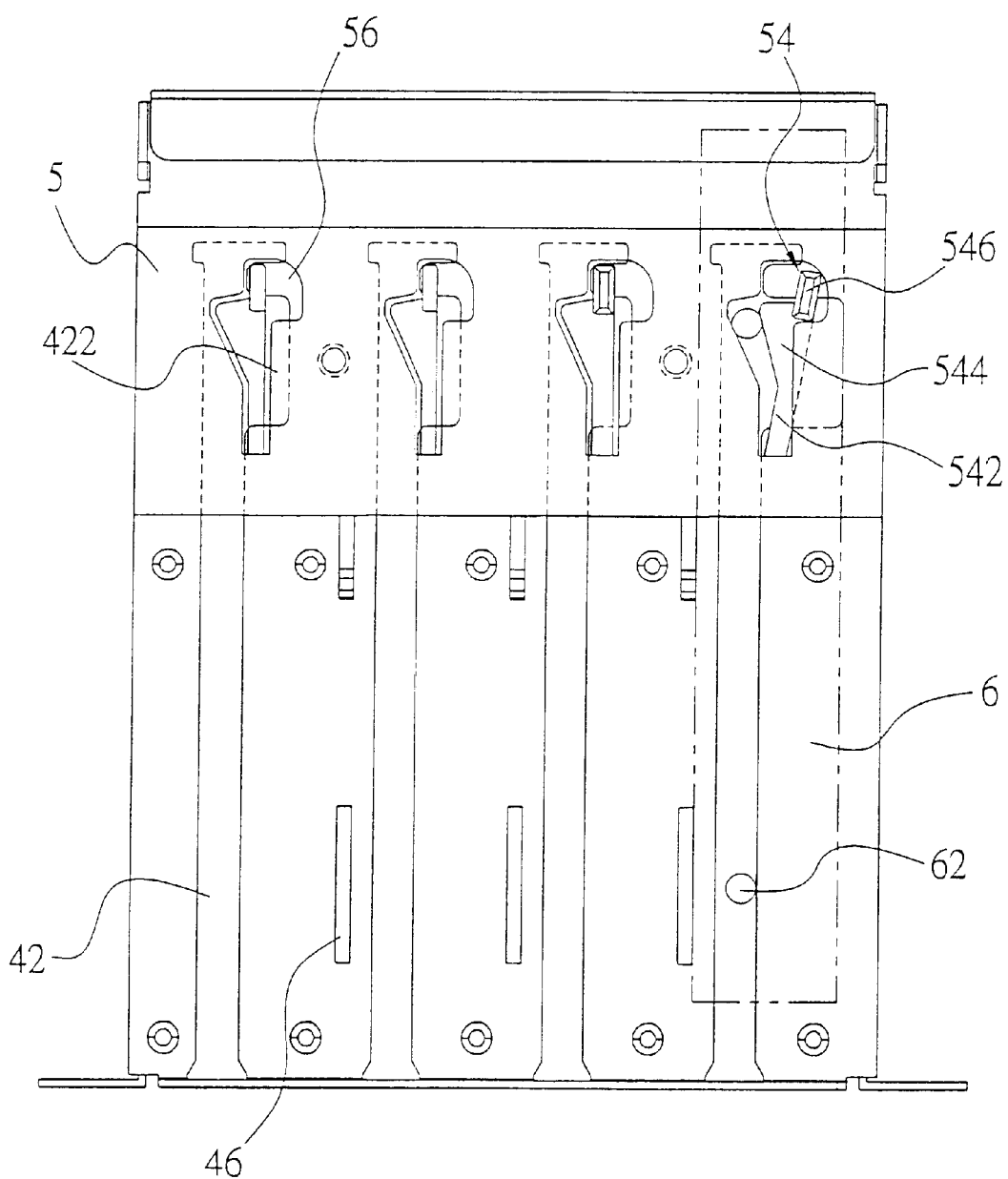
FIG. 5 is similar to FIG. 4 wherein hard disk is secured to frame.

Referring to FIGS. 4 and 5, in fastening hard disk 6 to frame 4, insert hard disk 6 into frame 4 with projections 62 of hard disk 6 sliding along grooves 42 wherein the front projection 62 slides along connection section 542 and bent section 544 until the projection 62 passes over bent section 544, and is secured by bent section 544 in opening 422. Further, the hard disk 6 is clung to recesses 46 such that hard disk 6 is secured to grooves 42. This procedure may repeat until a desired number of hard disks 6 are mounted in frame 4.

In detaching hard disk 6 from frame 4, simply push the engagement section 546 of latched member 54 to release the projection 62 of hard disk 6 from the latched member 54 prior to removing hard disk 6 from frame 4. The advantage is that other hard disks 6 may not drop from frame 4 after one hard disk 6 is removed.

While the invention herein disclosed has been described by means of specific embodiments, numerous modifications and variations could be made thereto by those skilled in the art without departing from the scope and spirit of the invention set forth in the claims.

What is claimed is:

1. A device disposed on a frame for fastening a plurality of hard disks each having at least one projections to the frame, the device comprising:

a plurality of pairs of opposed grooves on the frame;

a plurality of openings each disposed on one end of the groove;

a block member installed on the same side as the openings having a plurality of latched members respectively disposed in apertures thereon each corresponding to the opening; each extended to the opening;

wherein in fastening the hard disk, insert the hard disk into the frame with the projection of the hard disk sliding along the grooves until the projection contacts the latched member to be secured therein.

2. The device of claim 1, further comprising a pair of slots on either side of the top of the frame, and wherein the block member further comprises four snapping members extended downward on four corners of the bottom of the block member each engaged with the slot so as to secure the block member to the frame.

3. The device of claim 1, further comprising a plurality of recesses on either side of the frame adjacent to the grooves.

4. The device of claim 1, wherein the latched member further comprising a connection section connected to the block member, a bent section adjacent to the edge of the opening having one end connected to the connection section, and an upward extended engagement section connected to the other end of the bent section, and the movement of the engagement section is defined by the aperture.

* * * * *